(12) United States Patent
Hsu et al.

(10) Patent No.: US 8,691,681 B2
(45) Date of Patent: Apr. 8, 2014

(54) SEMICONDUCTOR DEVICE HAVING A METAL GATE AND FABRICATING METHOD THEREOF

(75) Inventors: Chi-Mao Hsu, Tainan (TW); Hsin-Fu Huang, Tainan (TW); Chin-Fu Lin, Tainan (TW); Min-Chuan Tsai, New Taipei (TW); Wei-Yu Chen, Tainan (TW); Chien-Hao Chen, Yun-Lin County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/343,690

(22) Filed: Jan. 4, 2012

(65) Prior Publication Data
US 2013/0168744 A1    Jul. 4, 2013

(51) Int. Cl.
*H01L 21/3205* (2006.01)
*H01L 21/4763* (2006.01)
*H01L 29/76* (2006.01)

(52) U.S. Cl.
USPC 438/592; 257/288; 257/E21.19; 257/E29.255

(58) Field of Classification Search
USPC ........ 438/592; 257/1, 2, 3, 4, 5, 288, E21.19, 257/E29.255
See application file for complete search history.

(56) References Cited

U.S. PATENT DOCUMENTS

| | | | |
|---|---|---|---|
| 6,020,024 A | 2/2000 | Maiti |
| 6,066,533 A | 5/2000 | Yu |
| 6,492,217 B1 | 12/2002 | Bai |
| 6,552,377 B1 | 4/2003 | Yu |
| 6,696,345 B2 | 2/2004 | Chau |
| 6,790,719 B1 | 9/2004 | Adetutu |
| 6,794,234 B2 | 9/2004 | Polishchuk |
| 6,902,969 B2 | 6/2005 | Adetutu |
| 6,921,711 B2 | 7/2005 | Cabral, Jr. |
| 7,030,430 B2 | 4/2006 | Doczy |
| 7,074,664 B1 | 7/2006 | White |
| 7,109,079 B2 | 9/2006 | Schaeffer, III |
| 7,126,199 B2 | 10/2006 | Doczy |
| 7,157,378 B2 | 1/2007 | Brask |
| 7,193,893 B2 | 3/2007 | Forbes |
| 7,208,366 B2 | 4/2007 | Tsai |
| 7,381,619 B2 | 6/2008 | Wang |
| 7,390,709 B2 | 6/2008 | Doczy |
| 7,488,656 B2 | 2/2009 | Cartier |
| 7,785,958 B2 | 8/2010 | Doczy |
| 2002/0127888 A1 | 9/2002 | Cho |
| 2005/0095763 A1 | 5/2005 | Samavedam |
| 2005/0202659 A1 | 9/2005 | Li |
| 2005/0275035 A1 | 12/2005 | Mathew |
| 2006/0040482 A1 | 2/2006 | Yang |
| 2006/0054943 A1 | 3/2006 | Li |

(Continued)

*Primary Examiner* — Wensing Kuo
*Assistant Examiner* — Moazzam Hossain
(74) *Attorney, Agent, or Firm* — Winston Hsu; Scott Margo

(57) ABSTRACT

The present invention provides a method of forming a semiconductor device having a metal gate. A substrate is provided and a gate dielectric and a work function metal layer are formed thereon, wherein the work function metal layer is on the gate dielectric layer. Then, a top barrier layer is formed on the work function metal layer. The step of forming the top barrier layer includes increasing a concentration of a boundary protection material in the top barrier layer. Lastly, a metal layer is formed on the top barrier layer. The present invention further provides a semiconductor device having a metal gate.

13 Claims, 5 Drawing Sheets

(56) References Cited

U.S. PATENT DOCUMENTS

| | | |
|---|---|---|
| 2007/0037335 A1 | 2/2007 | Chambers |
| 2007/0082445 A1 | 4/2007 | Yang |
| 2007/0138559 A1 | 6/2007 | Bohr |
| 2007/0148838 A1 | 6/2007 | Doris |
| 2007/0210354 A1 | 9/2007 | Nabatame |
| 2008/0076216 A1 | 3/2008 | Pae |
| 2008/0242012 A1* | 10/2008 | Pae et al. .................. 438/197 |
| 2008/0318371 A1 | 12/2008 | Lin |
| 2009/0057787 A1 | 3/2009 | Matsuki |
| 2009/0166769 A1 | 7/2009 | Metz |
| 2010/0052067 A1 | 3/2010 | Hsu |
| 2010/0052074 A1 | 3/2010 | Lin |
| 2010/0068877 A1 | 3/2010 | Yeh |
| 2010/0081262 A1 | 4/2010 | Lim |
| 2010/0244206 A1 | 9/2010 | Bu |
| 2012/0119204 A1* | 5/2012 | Wong et al. .................. 257/43 |

\* cited by examiner

SEMICONDUCTOR DEVICE HAVING A METAL GATE AND FABRICATING METHOD THEREOF

BACKGROUND OF THE INVENTION

1. Field of the Invention

The present invention relates to a semiconductor device having a metal gate and the fabrication method thereof, and more particularly, to a semiconductor device having a top barrier layer and the fabrication method thereof, where the top barrier layer includes a boundary protection material.

2. Description of the Prior Art

Poly-silicon is conventionally used as a gate electrode in semiconductor devices, such as metal-oxide-semiconductors (MOS). However, with a trend toward scaling down the size of semiconductor devices, the conventional poly-silicon gate faces problems like low performances due to boron penetration, and unavoidable depletion effect that increases the equivalent thickness of the gate dielectric layer, reduces the gate capacitance, and worsens a driving force of the devices. Therefore, work function metals are used to replace the conventional poly-silicon gates as control electrodes that are suitable as high-K gate dielectric layers.

In a complementary metal-oxide semiconductor (CMOS) device, one of the dual work function metal gates is used in an NMOS device and the other one is alternatively used in a PMOS device. It is well-known that the compatibility and the process controls of the dual metal gates are more complicated, whereas the thickness and the composition controls of the materials used in the dual metal gate method are more precise. The conventional dual metal gate methods are categorized into gate first processes and gate last processes. In a conventional dual metal gate method applied with the gate first process, the annealing process for forming the source/drain ultra-shallow junction and the silicide process are performed after forming the metal gate. In the conventional gate last process, a sacrificial gate or a replacement gate is provided in a first step, followed by performing processes used to construct a normal MOS transistor. Then, the sacrificial/replacement gate is removed to form a gate trench. Consequently, the gate trench is filled with metals according to the different electrical requirements. However, because of the complicated steps of the gate last processes, the manufacturers are devoted to simplifying the manufacturing process.

In the gate first process or the gate last process, the metal gate of the PMOS or the NMOS may include a plurality of metal layers. The materials of the metal layers always affect the work function of the NMOS or the PMOS, and consequently affect the performances of the product. Thus, the manufacturers are searching for new manufacturing method to obtain a MOS with better work function performances.

SUMMARY OF THE INVENTION

The present invention therefore provides a semiconductor device having a top barrier layer and the fabrication method thereof, and the top barrier layer includes a boundary protection material, which is able to improve the barrier function of the top barrier layer.

According to one embodiment of the present invention, a method of forming a semiconductor device having a metal gate is provided. A substrate is provided, and a gate dielectric and a work function metal layer are formed thereon, wherein the work function metal layer is on the gate dielectric layer. Then, a top barrier layer is formed on the work function metal layer. The step of forming the top barrier layer includes increasing a concentration of a surface protection material in the top barrier layer. Lastly, a metal layer is formed on the top barrier layer.

According to another embodiment of the present invention, a semiconductor device having a metal gate is provided. The device includes a substrate, a gate dielectric layer, a work function metal layer, a top barrier layer and a metal layer. The gate dielectric layer is disposed on the substrate, and the work function metal layer is disposed on the gate dielectric layer. The top barrier layer is disposed on the work function metal layer wherein the top barrier layer includes a boundary protection material in which a concentration thereof near the substrate is substantially less than that far from the substrate. The metal layer is disposed on the top barrier layer.

Due to the presence of boundary protection materials in the top barrier layer, such as oxygen or nitrogen, the protection function of the top barrier layer can be improved and the phenomenon of metal layer diffusion or spiking can be prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
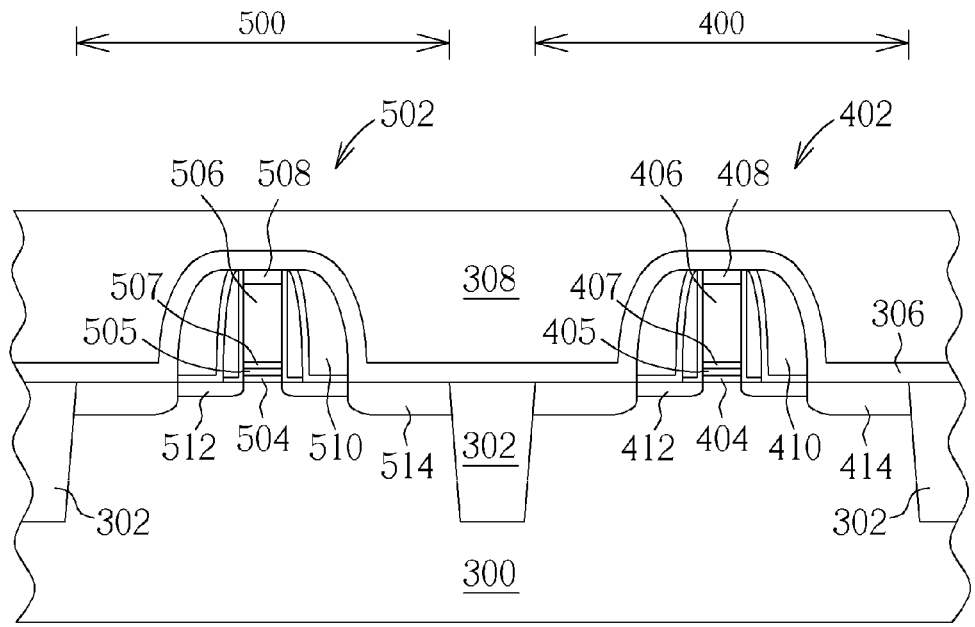
FIG. 1 to FIG. 10 are schematic diagrams illustrating the method for fabricating a semiconductor device having a metal gate of the present invention.

To provide a better understanding of the present invention, preferred embodiments will be described in detail. The preferred embodiments of the present invention are illustrated in the accompanying drawings with numbered elements.

Please refer to FIG. 1 to FIG. 10. FIGS. 1 to 10 are schematic diagrams of the method for fabricating a semiconductor device having a metal gate. First, a substrate 300 is provided, such as a silicon substrate, a silicon-containing substrate or a silicon-on-insulator (SOI) substrate. A plurality of shallow trench isolations (STI) 302 is disposed on the substrate 300. In one embodiment, the STI 302 can provide a stress. According to the areas encompassed by the STI 302, a first active region 400 and a second active region 500, which are insulated from each other, are defined on the substrate 300. Then, a first conductive type transistor 402 and a second conductive type transistor 502 are formed on the substrate 300 in the first active region 400 and the second active region 500 respectively. In one preferred embodiment of the present invention, the first conductive type transistor 402 is a P-type transistor, while the second conductive type transistor 502 is an N-type transistor.

In one embodiment shown in FIG. 1, the first conductive type transistor 402 includes a first interface layer 404, a first high-k layer 405, a first etch stop layer 407, a first sacrificial gate 406, a first cap layer 408, a first spacer 410, a first lightly doped drain (LDD) 412 and a first source/drain 414. In one preferred embodiment of the present invention, the first interface layer 404 can be a $SiO_2$ layer. The high-k gate dielectric layer includes rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The first etch stop layer 407 includes metal/metal nitride, such as TiN. The first sacrificial gate 406 is a poly-silicon gate. In another embodiment, the first sacrificial gate 406 is a multi-layered gate including a poly-silicon layer, an amorphous silicon layer or a germanium layer. The first cap layer 408 is a SiN layer for example. The first spacer 410 can be a multi-layered structure including high temperature oxide (HTO), SiN, SiO or SiN formed by hexachlorodisilane ($Si_2Cl_6$) (HCD-SiN). In one embodiment, the first spacer 410 can be partially or completely removed to induce a desired stress in the contact etch stop layer (CESL) 306 toward the first conductive type transistor 402 and the second conductive type transistor 502. The first LDD 412 and the first source/drain 414 are formed by appropriate dopants implantation. In one embodiment, the first interfacial layer 404 and the first etch stop layer 407 can be omitted.

The second conductive type transistor 502 includes a second gate dielectric layer 504, a second sacrificial gate 506, a second cap layer 508, a second spacer 510, a second LDD 512 and a second source/drain 514. The components in the second conductive type transistor 502 of this embodiment are similar to that of the first conductive type transistor 402 and are therefore not described repeatedly. In addition, the first conductive type transistor 402 and the second conductive type transistor 502 can further include other semiconductor structures that are not explicitly shown in FIG. 1, such as a silicide layer, a source/drain having an hexagon (also called sigma Σ) or an octagon shaped cross-section which is formed by selective epitaxial growth (SEG), or other protective films. After forming the first conductive type transistor 402 and the second conductive type transistor 502, a contact etch stop layer (CESL) 306 and an inter-layer dielectric (ILD) layer 308 are formed on the substrate 300 to cover the first conductive type transistor 402 and the second conductive type transistor 502. In one embodiment, the CESL 306 can generate a stress to form a selective strain scheme (SSS) wherein a compressing force is applied on the first conductive type electrode 402 and a straining force is applied on the second conductive type electrode 502.

Figure 2:
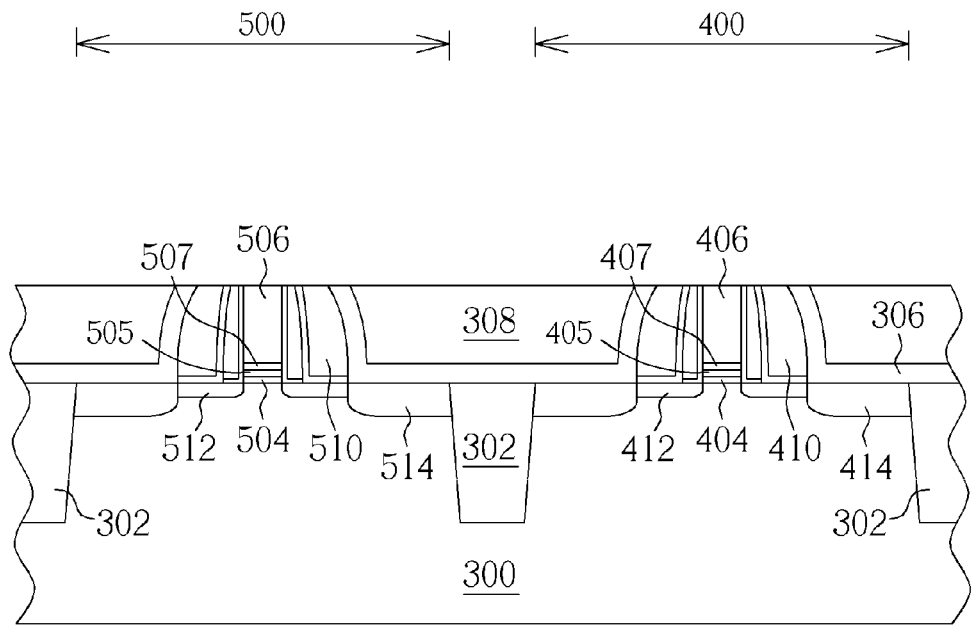

As shown in FIG. 2, a planarization process, such as a chemical mechanical polish (CMP) process or an etching-back process or combination thereof is performed to remove a part of the ILD layer 308, a part of the CESL 306, a part of the first spacer 410, a part of the second spacer 510, and completely remove the first cap layer 408 and the second cap layer 508, until the top surfaces of the first sacrificial gate 406 and the second sacrificial gate 506 are exposed.

Figure 3:
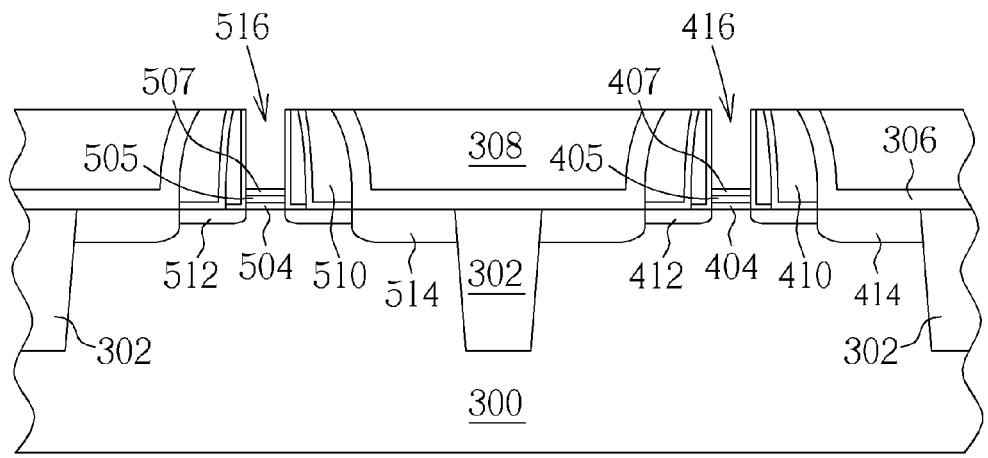

As shown in FIG. 3, a wet etching process and/or a dry etching process is performed to remove the first sacrificial gate 406 and the second sacrificial gate 506 until exposing the first etch stop layer 407 and the second etch stop layer 507. A first trench 416 is formed in the first conductive type transistor 402 and a second trench 516 is formed in the second conductive type transistor 502. In one embodiment, after forming the first trench 416 and the second trench 516, the first etch stop layer 407 and the second etch stop layer 507 can be removed.

Figure 4:
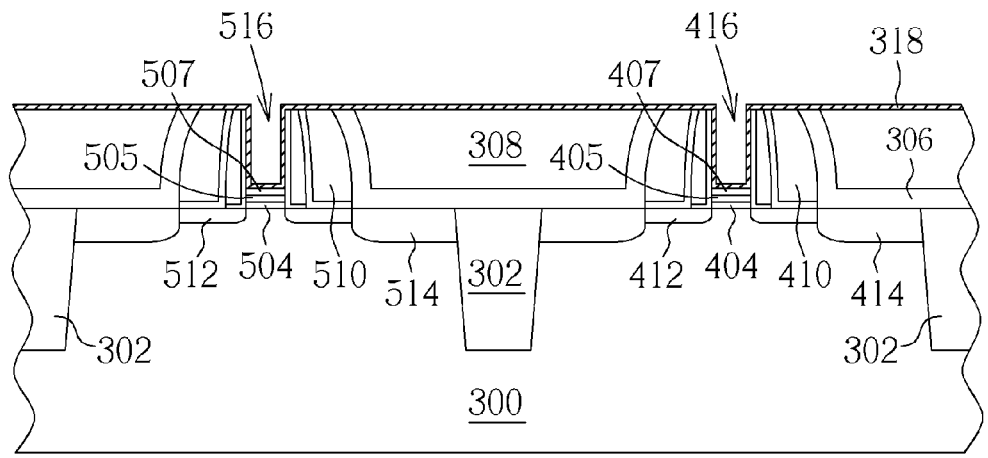

As shown in FIG. 4, a P type work function metal layer 318 is formed on the substrate 300. In the present embodiment, the P type work function metal layer 318 serves as a work function metal required in a P-type transistor and includes Ni, Pd, Pt, Be, Ir, Te, Re, Ru, Rh, W, Mo, or WN, RuN, MoN, TiN, TaN, or WC, TaC, TiC, or TiAlN, TaAlN, but should not be limited thereto. In one embodiment, before forming the P type work function metal layer 318, a bottom barrier layer (not shown) can optionally be formed, such as a TaN layer.

Figure 5:
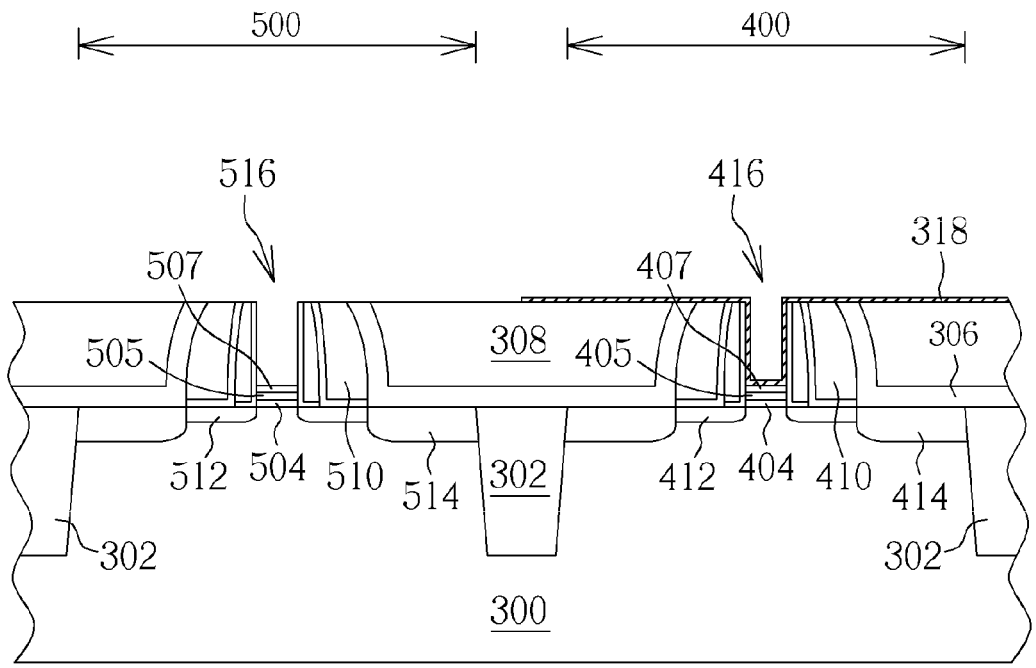
Figure 6:
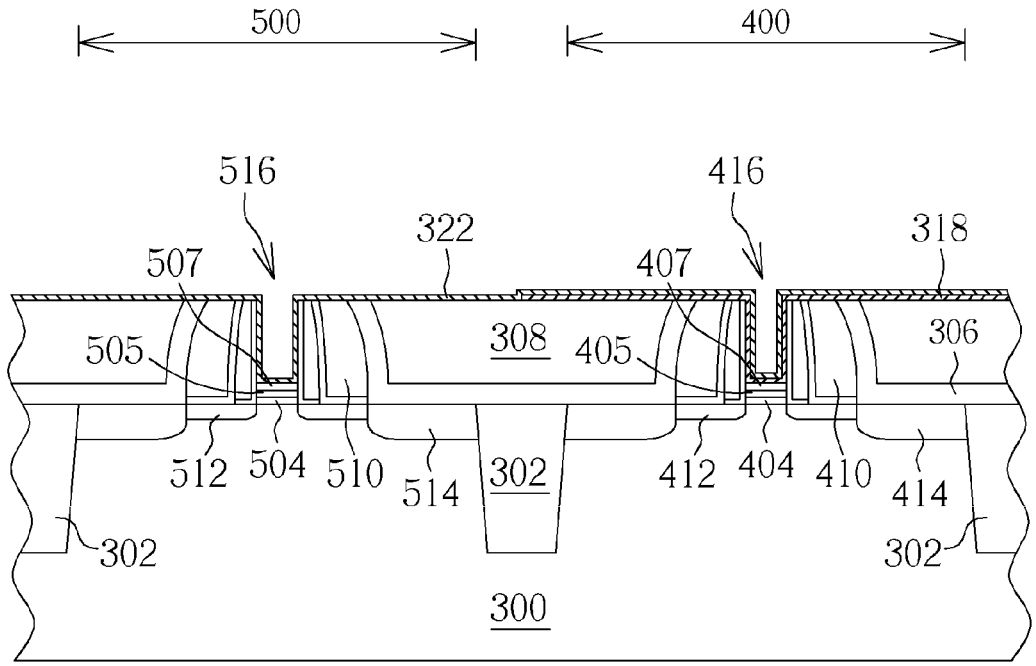

As shown in FIG. 5, the P type work function metal 318 is patterned to remove the P type work function metal 318 in the second active region 500. Remaining P type work function layer 318 at least covers the surface of the first trench 416. As shown in FIG. 6, an N type work function metal layer 322 is formed on the substrate 300. The N type work function metal layer 322 is formed on the surface of the ILD layer 308 and the second trench 516 in the second active region 500 and on the surface of the P type work function metal layer 318 in the first region 400. However, the first trench 416 and the second trench 516 are not completely filled with the N type work function metal layer 322. In one preferred embodiment of the present invention, the N type work function metal layer 322 serves as a work function metal required by an N-type transistor and includes titanium aluminides (TiAl), aluminum zirconium (ZrAl), aluminum tungsten (WAl), aluminum tantalum (TaAl) or aluminum hafnium (HfAl), but should not be limited thereto.

Figure 7:
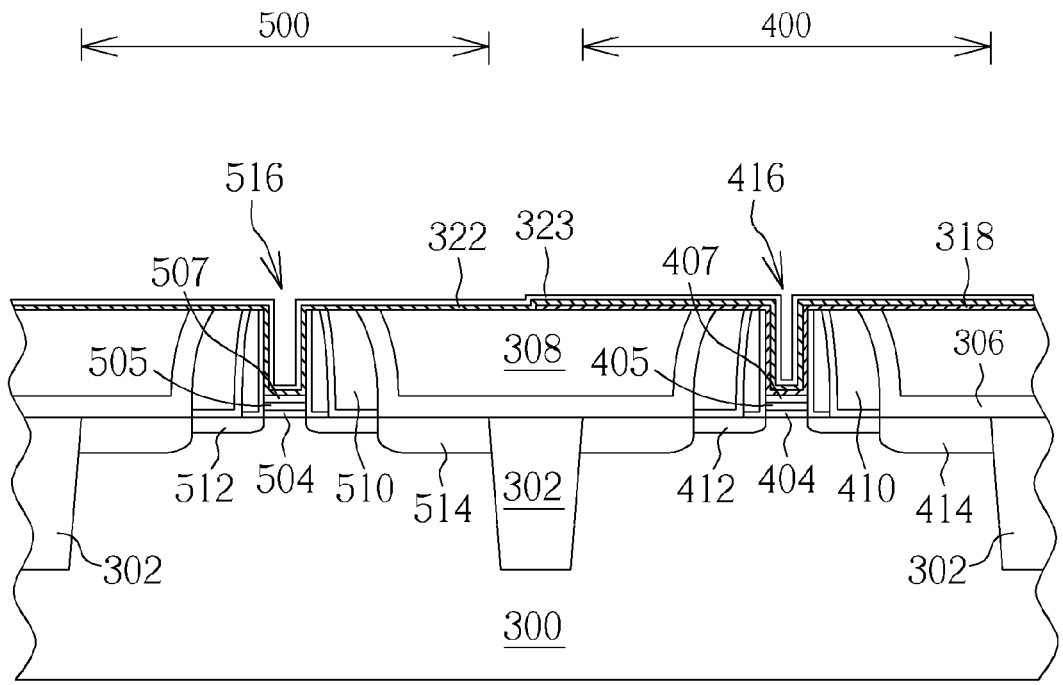

As shown in FIG. 7, a top barrier layer 323 is formed on the substrate 300. The top barrier layer 323 is formed on the surface of the N type work function metal layer 322 in the first active region 400 and the second active region 500 but does not completely fill the first trench 416 and the second trench 516. In one preferred embodiment, the top barrier layer includes Ti/TiN or Ta/TaN, which can be formed by a physical deposition (PVD) process for example. It is one salient feature of the present invention that, when forming the top barrier layer 323, the composition therein can be adjusted to increase a concentration of a boundary protection material. In one embodiment, the boundary protection material is oxygen or nitrogen. For instance, when forming the top barrier layer 323, an in situ doping process can be performed by importing oxygen into the chamber so that the oxygen is diffused within the top barrier layer 323. Preferably, the importing concentration of the oxygen can gradually increase during the process, and the top barrier layer 323 exhibits an oxygen concentration gradient wherein the concentration near the substrate 300 is substantially less than that far from the substrate 300. In another embodiment, the top barrier layer 323 can be formed by increasing the concentration of nitrogen such that the molecular percentage thereof is substantially superior to 50%. Preferably, the importing concentration of the nitrogen can gradually increase during the process so that the top barrier layer 323 exhibits a nitrogen concentration gradient wherein the concentration near the substrate 300 is substantially less than that far from the substrate 300.

Figure 8:
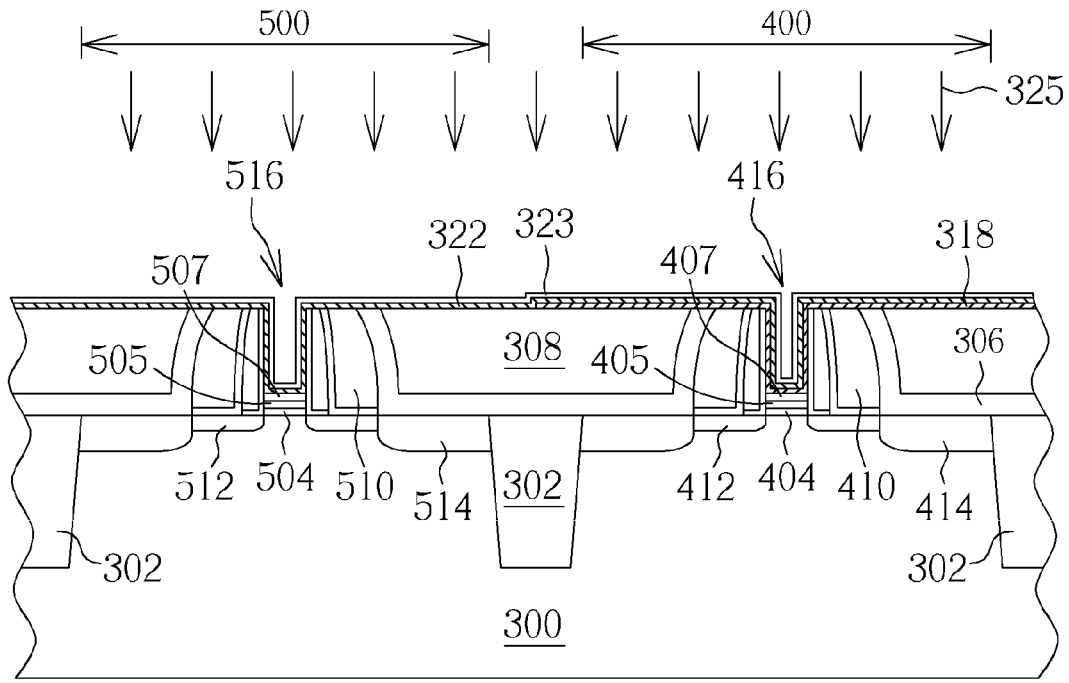

In another embodiment as shown in FIG. 8, after forming the top barrier layer 323, a protection enhancing step 325 can be further performed to increase the concentration of the boundary protection material such as oxygen and/or nitrogen. In one embodiment of the present invention, the protection enhancing step 325 includes performing an oxygen treatment and/or a nitrogen treatment. The oxygen treatment includes an oxygen-containing annealing process, an oxygen-containing plasma treatment process or an oxygen-containing chemical treatment process. In one preferred embodiment, the oxygen-containing annealing process includes supplying gas containing $O_2$ at a temperature comprised between 300° C. and 500° C., preferably a 100% $O_2$ gas under 400° C. for 10-30 seconds, preferably 20 seconds. The oxygen-containing plasma treatment process includes using plasma containing $O_2$. The oxygen-containing chemical treatment includes using a chemical solvent containing $NH_4OH$, $H_2O_2$ and $H_2O$, such as $SC_1$ solvent. In one embodiment, the nitrogen treatment includes a nitrogen-containing annealing process or a nitrogen-containing plasma treatment process. In one preferred embodiment, the nitrogen-containing annealing process includes supplying gas containing $N_2$ at a temperature comprised between 300° C. and 500° C., preferably a 100% $N_2$ gas under 400° C. for 10-30 seconds, preferably 20 seconds. The nitrogen-containing plasma treatment process includes using plasma containing $N_2$. It is noted that the oxygen treatment and the nitrogen treatment can be carried out alternatively. In another embodiment, the oxygen treatment and the nitrogen treatment can be performed chronological or simultaneously. For example, the oxygen-containing annealing process can be performed and then the nitrogen-containing annealing process is performed. Or, the oxygen-containing annealing process and the nitrogen-containing annealing process are performed simultaneously by supplying a gas containing $N_2$ and $O_2$ under 400° C. The boundary protection material can therefore be formed in the top barrier layer 323 and preferably the concentration thereof in the top barrier layer near the substrate 300 is substantially less than that far from the substrate 300.

The boundary protection material can improve the barrier ability of the top barrier layer 323 so as to avoid, or reduce, the phenomenon of low-resistance metal layer (not shown in FIG. 8) diffusing or spiking into the top barrier layer 323. As described above, the increasing of the concentration of the boundary protection material can be done during the forming process of the top barrier layer 323, right after forming the top barrier layer 323, or at both moments.

Figure 9:
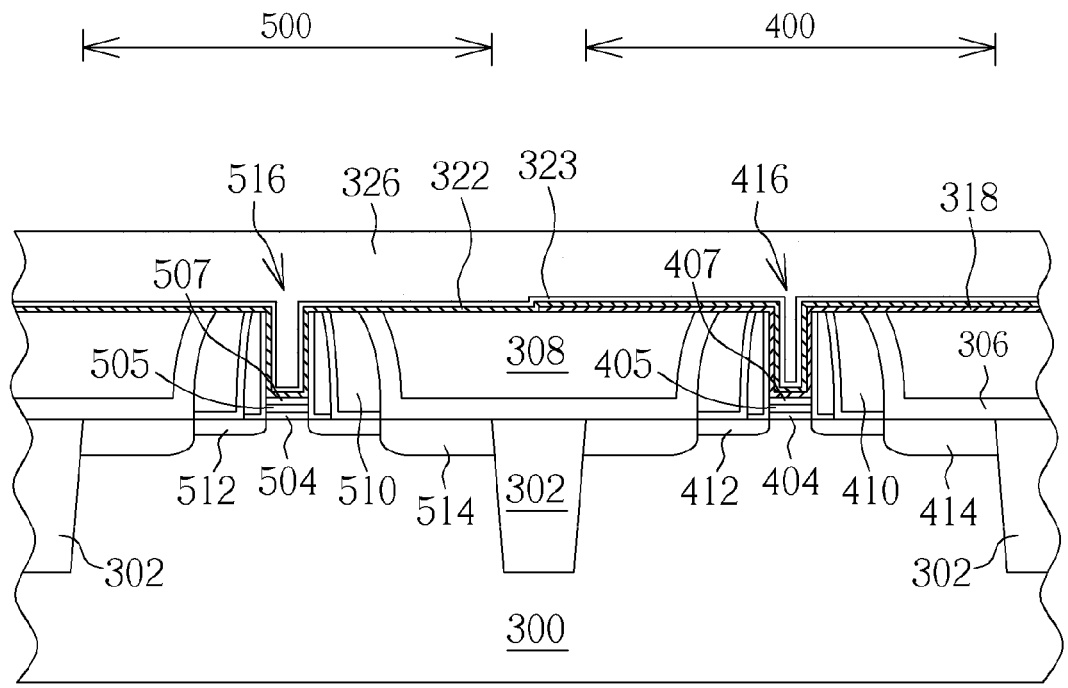

As shown in FIG. 9, a low resistive metal layer 326 is formed on the substrate 300. The metal layer 326 is formed on the top barrier layer 323 and completely fills the first trench 416 and the second trench 516. The metal layer 326 includes Al, Ti, Ta, W, Nb, Mo, TiN, TiC, TaN, Ti/W or Ti/TiN, but is not limited thereto.

Figure 10:
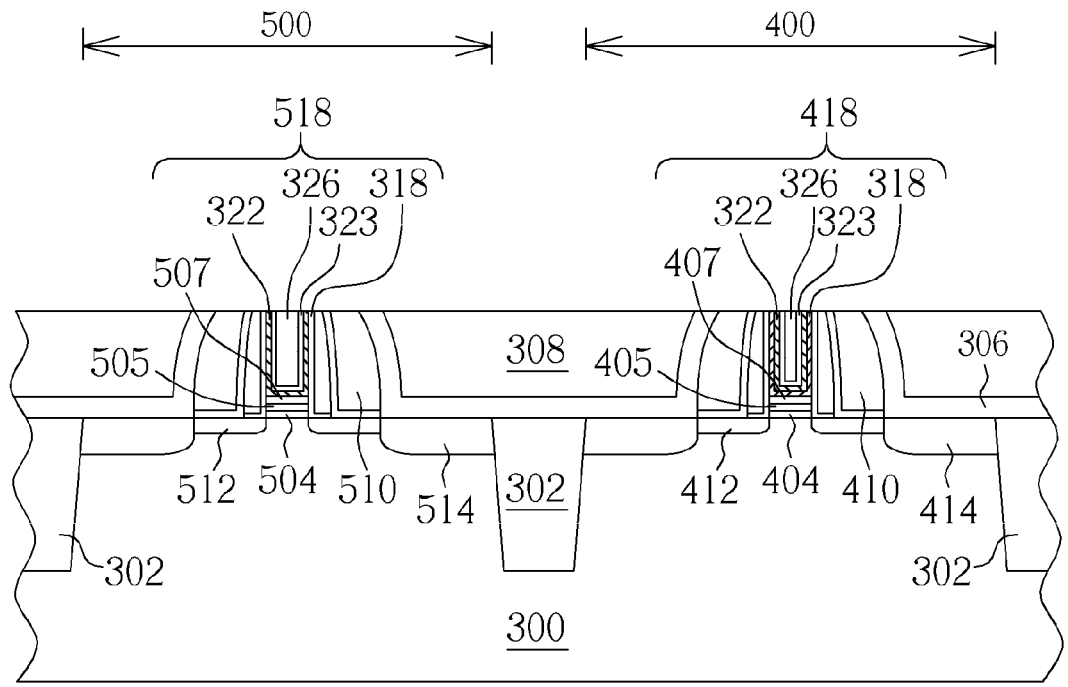

As shown in FIG. 10, a planarization process is performed to simultaneously remove the P type work function metal layer 318, the N type work function metal layer 322, the top barrier layer 323 and the metal layer 326 outside of the first trench 416 and the second trench 516. Thus, the first etch stop layer 407 (optional), the P type work function metal layer 318, the N type work function metal layer 322, the top barrier layer 323 and the metal layer 326 in the first trench 416 together form a first metal gate 418 of the first conductive type transistor 402 (P-type transistor), which has a work function substantially between 40.8 eV and 50.2 eV. The second etch stop layer 507 (optional), the N type work function metal layer 322, the top barrier layer 323 and the metal layer 326 in the second trench 516 together form a second metal gate 518 of the second conductive type transistor 502 (N-type transistor) which has a work function substantially between 3.9 eV and 4.3 eV. In another embodiment, the thicknesses of the P type work function metal layer 318, the N type work function metal layer 322 and the top barrier layer 323 can be modified to adjust the work function.

After finishing the first metal gate 418 and the second metal gate 518, a contact plug forming process can be carried out, for example, a contact plug having a stress can be formed. In another embodiment, before forming the contact plug, the ILD layer 306 and the CESL 308 can be completely removed. Then, at least one CESL (not shown) can be formed on the substrate 300. By applying an UV or a heat energy treatment, the new CSEL can generate a stress, thereby enhancing the efficiency of the first conductive type transistor 402 and the second conductive type transistor 502 respectively. Another ILD layer (not shown) is then formed and at least a contact plug having appropriate stress can be formed therein.

It should be noted that the above method shown in a gate-last process can also be applied in a gate-first process. Besides, the above methods present forming the high-k gate dielectric layer in a first step (namely, the high-K first process). However, those skilled in the art can realize that, in the present invention, it is also possible to form the high-k layer 405 after removing the sacrificial gate (namely, the high-K last process). For example, a high-K layer can be formed on the surface of the first trench 416 before forming the P type work function metal layer 318. Subsequently, the P type work function metal layer 318 and the metal layer 326 are formed on the high-K gate dielectric layer in the first trench 416. In this embodiment, the high-K gate dielectric layer and the P type work function metal layer 318 will form a U shape in their cross section. In another embodiment, it is also available to form a high-K gate dielectric layer on the surface of the second trench 516 before forming the N type work function metal layer 322. Then, the N type work function metal layer 322 and the metal layer 326 are formed on the high-K gate dielectric layer in the second trench 516. In this embodiment, the high-K gate dielectric layer and the N type work function metal layer 322 will form a U shape in their cross section. In addition, when the invention is performed in the high-k last process, the material of the dielectric layer formed under the sacrificial gate is not limited to high-k material but can also include another dielectric material such as $SiO_2$. In another embodiment, the first conductive type transistor 402 and the second conductive type transistor 502 can be non-planar transistors such as Fin-FET and is not limited to the planar transistor application shown above.

In summary, a semiconductor device having a metal gate and its fabrication method thereof are provided in the present invention. The semiconductor device specifically includes a top barrier layer with boundary protection material. Due to the increased concentration of the boundary protection material, the protection function of the top barrier layer can be improved and the phenomenon of metal layer diffusion, or spiking, can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device having a metal gate, comprising:
    providing a substrate;
    forming a gate dielectric layer and a work function metal layer on the substrate wherein the work function metal layer is disposed on the gate dielectric layer;
    forming a top barrier layer on the work function metal layer, wherein the step of forming the top barrier layer includes increasing a concentration of a boundary protection material in the top barrier layer; and
    forming a metal layer on the top barrier layer.

2. The method of fabricating a semiconductor device having a metal gate as in claim 1, wherein the boundary protection material comprises oxygen.

3. The method of fabricating a semiconductor device having a metal gate as in claim 1, wherein the boundary protection material comprises nitrogen.

4. The method of fabricating a semiconductor device having a metal gate as in claim 1, wherein after forming the top barrier layer, a protection enhancing step is performed to increase the concentration of the boundary protection material.

5. The method of fabricating a semiconductor device having a metal gate as in claim 4, wherein the protection enhancing step comprises an oxygen treatment.

6. The method of fabricating a semiconductor device having a metal gate as in claim 5, wherein the oxygen treatment comprises an oxygen-containing annealing process, an oxygen-containing plasma treatment process or an oxygen-containing chemical treatment process.

7. The method of fabricating a semiconductor device having a metal gate as in claim 4, wherein the protection enhancing step comprises a nitrogen treatment.

8. The method of fabricating a semiconductor device having a metal gate as in claim 7, wherein the nitrogen treatment comprises a nitrogen-containing annealing process or a nitrogen-containing plasma treatment process.

9. The method of fabricating a semiconductor device having a metal gate as in claim 1, wherein the semiconductor device comprises an N type transistor or a P type transistor.

10. A semiconductor device having a metal gate, comprising:

a substrate;
a gate dielectric layer disposed on the substrate;
a work function metal layer disposed on the gate dielectric layer;
a top barrier layer disposed on the work function metal layer, wherein the top barrier layer comprises a boundary protection material having a concentration gradient in which the concentration of the boundary protection material in the top barrier layer near the substrate is substantially less than the concentration of the boundary protection material far from the substrate; and
a metal layer disposed on the top barrier layer.

11. The semiconductor device having a metal gate as in claim 10, wherein the boundary protection material comprises oxygen.

12. The semiconductor device having a metal gate as in claim 10, wherein the boundary protection material comprises nitrogen.

13. The semiconductor device having a metal gate as in claim 10, wherein the semiconductor device comprises an N type transistor or a P type transistor.

* * * * *